United States Patent
Bourrieres et al.

(10) Patent No.: US 6,783,797 B2
(45) Date of Patent: Aug. 31, 2004

(54) DEVICE FOR COLLECTIVELY FILLING BLIND CAVITIES

(75) Inventors: Francis Bourrieres, Montauban (FR); Clement Kaiser, Montauban (FR)

(73) Assignee: Societe Novatec S.A., Montrauban (FR)

( * ) Notice: Subject to any disclaimer, the term of this patent is extended or adjusted under 35 U.S.C. 154(b) by 0 days.

(21) Appl. No.: 10/169,679

(22) PCT Filed: Dec. 13, 2000

(86) PCT No.: PCT/FR00/03494
§ 371 (c)(1),
(2), (4) Date: Jul. 1, 2002

(87) PCT Pub. No.: WO01/49422
PCT Pub. Date: Jul. 12, 2001

(65) Prior Publication Data
US 2003/0000084 A1 Jan. 2, 2003

(30) Foreign Application Priority Data
Jan. 3, 2000 (FR) .............................. 00 00008
Jul. 26, 2000 (FR) .............................. 00 09785

(51) Int. Cl.[7] .............................. B05D 5/12; B05C 3/00; C23C 14/00
(52) U.S. Cl. ..................... 427/97; 427/294; 427/300; 427/350; 118/50; 118/415; 118/429
(58) Field of Search .................. 427/300, 97, 294, 427/350; 118/50, 415, 429

(56) References Cited

U.S. PATENT DOCUMENTS

| 4,968,534 A | * 11/1990 | Bogardy ...................... 427/282 |
| 6,231,333 B1 | * 5/2001 | Gruber et al. .............. 425/546 |
| 6,461,136 B1 | * 10/2002 | Gruber et al. .............. 425/110 |

FOREIGN PATENT DOCUMENTS

| WO | 97/48500 | 12/1997 |
| WO | 99/47260 | 9/1999 |

* cited by examiner

*Primary Examiner*—Brian K. Talbot
(74) *Attorney, Agent, or Firm*—Vidas, Arrett & Steinkraus

(57) ABSTRACT

Device for filling multiple blind holes. The invention involves a device that permits the filling of blind holes in an effective and controlled manner.

It is composed of a mobile body (1) in airtight contact with the surface (10) containing the hole openings. The body (1) contains two slots, the first (2) of which is kept airtight from the exterior of the device and from the second slot (5), is separate and parallel to the direction of travel of the device, and is larger than the largest opening. The first slot exposed to the openings while moving is connected to a vacuum chamber (3), while the second slot exposed to the openings is connected to a reservoir (6) containing the product (7) to be transferred.

10 Claims, 6 Drawing Sheets

DEVICE FOR COLLECTIVELY FILLING BLIND CAVITIES

The purpose of a device utilizing this invention is to fill blind holes with viscous products. Filling blind holes with viscous products is difficult due to the fact that air or gas present in the hole, along with the viscosity or surface tension of the product, hinder proper filling of small or narrow holes.

The applications for this device are many: for example it is applicable, but not limited, to fields such as electronics, medicine, connection paths for circuits on circuit boards, . . . It is particularly useful for filling microcavities in space and in military applications.

This patent application is presented in continuation of patent FR00.00008 established on Jan. 3, 2000 submitted by the same applicant, the internal priority of which is claimed.

In order to prevent air that is present in the hole from hindering proper filling by the product, the operation is conducted in a vacuum. The usual method is to place the holes to be filled in a sealed enclosure that is subjected to a vacuum, whereupon the product is forced into the holes using a syringe or dispenser. This technique, although functional, presents a certain number of problems, for example:

the vacuum enclosure must be large enough to contain the injection system, which requires a corresponding increase in vacuum pump size.

It is also necessary to deal with all of the sealing problems between the interior and exterior of the vacuum chamber. This creates a number of difficulties for accessibility and for refilling the device with product, and consequently for the cost of using this type of equipment.

Finally, this type of equipment is not well suited to continuous series production because it requires airlocks for entry and exit between the interior and exterior of the vacuum chamber, or else a step-by-step approach that requires the vacuum to be created again between each step. In any event, this type of equipment becomes extremely complex and expensive.

Moreover, in order to insert a viscous product into a small or narrow hole, the product must be injected under pressure at the openings in order to force filling.

Other techniques have been developed in order to insert products into small diameter tubes or parts that are more or less porous. These techniques described in patents WO9748500A and WO9947260A consist of applying the product to one side of the part to be treated and applying a vacuum to the other side, thereby drawing the product through the part. These techniques are not applicable to filling blind holes and are not transposable to this case.

This invention proposes a solution that is effective and simple to implement. It consists of consecutively and continuously creating a vacuum and then filling right at the hole level, with the filling occurring slightly after the vacuum is created. This is managed essentially by the juxtaposition of two slots in one device. The first slot is connected to a vacuum generator, while the second is connected to a reservoir containing the product. The first slot, which is connected to the vacuum, is simultaneously kept airtight in relation to the exterior and from the second slot by a distance measured parallel to the direction of travel of the device that is larger than the largest opening of the holes to be filled. A perfect seal is made between the surface containing the two slots and the substrate containing the holes to be filled. When the device is moved relative to the substrate, the openings of the holes are sequentially:

isolated in an airtight fashion relative to the exterior of the device, exposed to the slot connected to the vacuum, creating a vacuum within the holes, exposed to the slot containing the filling product. Since the product is at atmospheric pressure, it is at a higher pressure when it reaches the opening and is drawn in by the hole until the pressure in the hole is equal to that in the product reservoir. As long as the vacuum is sufficient, the entire hole will be filled with the product.

This device is extremely useful if one wants to fill the holes while avoiding the presence of air bubbles.

Moreover, if the hole openings are not situated in a way that permits the creation of a vacuum between them and the surface of the device, or if one wishes to avoid having the product in contact with the surface of the substrate, a screen can be inserted between the device and the substrate to be filled. The screen can be made of a metallic or synthetic sheet that will be placed in direct and airtight contact with the substrate. It is also possible to use a temporary or permanent screen made from photographic film that is rolled or attached to the substrate.

Likewise it is possible to do silk-screening by inserting a screen between the device and the substrate. In this case, the blind hole is replaced by the gap between the screen and the substrate, and the screen is separated from the substrate after the device has passed, leaving an extra-thick deposit of product on the substrate. This invention can therefore be adapted well to a silk-screen machine and, in such an event, a third slot, identical to the first, can be placed on the opposite side of the second slot so the system can function in two directions, in this case creating the vacuum alternately from the first or third slots depending on the direction of the device's movement.

Depending on the particular details of the procedure:

Scraping blades can be added before and behind the distribution slot to ensure a better seal for the slot connected to the reservoir. These scraping blades can be made from a single blade that is bent and pierced so that the two ends are located before and behind the distribution slot, while the hole permits the passage of product. A support can be used to strengthen the blades in contact with the surface to be scraped.

To ensure a better seal between the body of the device and the surface to be scraped containing the hole openings, the lower part of the device can be made of a deformable material such as polyurethane, which will conform to surface irregularities and thereby prevent any escape. Naturally, seals placed on the invention device's active surface can perform the same function.

In order to properly scrape away excess product, a scraping blade can also be set up as a back wall on the device with an angle in relation to the substrate greater than 90°.

To increase the speed at which the holes are filled by the product, the pressure of the product within the reservoir can be increased.

Other characteristics and advantages of the invention will appear in the descriptions of the attached drawings that illustrate the invention.

Figure 1:
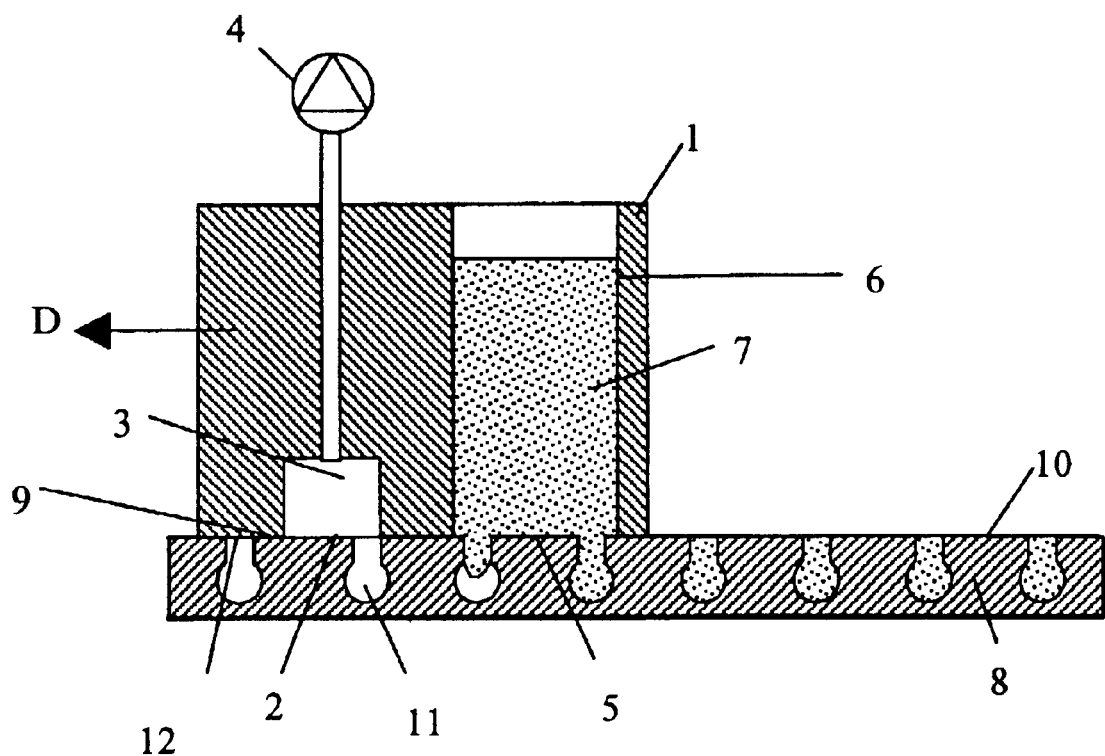
FIG. 1 illustrates, in section, a device utilizing the invention.

In reference to these drawings, one can see in figure 1 the body (1) containing the first pressure slot (2) connected to a vacuum chamber (3) which itself is connected to a vacuum pump (4) of any known type. A second slot (5), known as the distribution slot, is connected to a reservoir (6) containing the product (7). The body (1) can be set in motion relative to the substrate (8) in direction (D), while maintaining airtight contact between the surface (9) of the body (1) and the surface (10) of the substrate (8) containing the holes (11) to be filled. When the device (1) moves in direction (D), the openings (12) of the boles (11) to be filled are sequentially:

isolated by an airtight seal from the outside, exposed to the slot connected to the vacuum, placed in contact with the slot connected to the reservoir containing the filling product.

Since the first slot is sealed airtight from both the exterior and from the second slot by a distance measured parallel to the direction of travel of the device (1) that is larger than the largest opening in the substrate (8), each hole is sequentially exposed to the vacuum in contact with the pressure slot (2), without being simultaneously in contact with either the outside or the second slot (5). Filling then occurs by suction of the product (7) during contact with the distribution slot (5). Since the surfaces (9) and (10) are in airtight contact, the vacuum created within the hole by slot (2) is maintained until the product, which is at a higher pressure than that inside the hole, comes into contact with that same hole, at which point the product is drawn in until the pressure there is equal to that in the product reservoir. If the vacuum is sufficient and there are no air bubbles in the product within the reservoir, this device fills the holes completely and evenly no matter what the viscous product may be.

Figure 2:
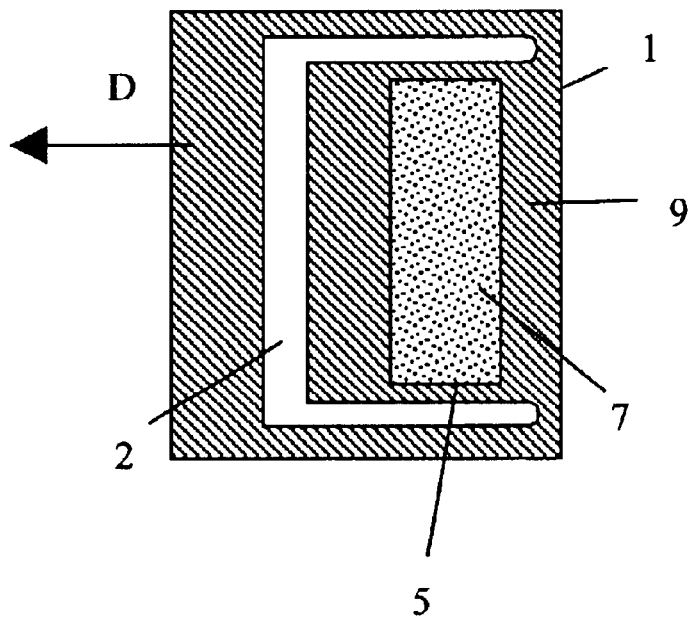
FIG. 2 illustrates a bottom view of a device utilizing the invention.

FIG. 2 illustrates the surface (9) of the body (1). The pressure slot (2) here surrounds the distribution slot (5) on three sides so the stability of the vacuum between the two slots is completely preserved and permits optimal filling. This layout is particularly effective since it permits optimal contact between the two surfaces (9) and (10), thanks to the pressure from slot (2), the airtight contact between the two surfaces is assured. It is possible to improve the airtight contact still further by adding seals to the surface (9) or making the lower part of the body (1) from a deformable material such as polyurethane.

Figure 3A:
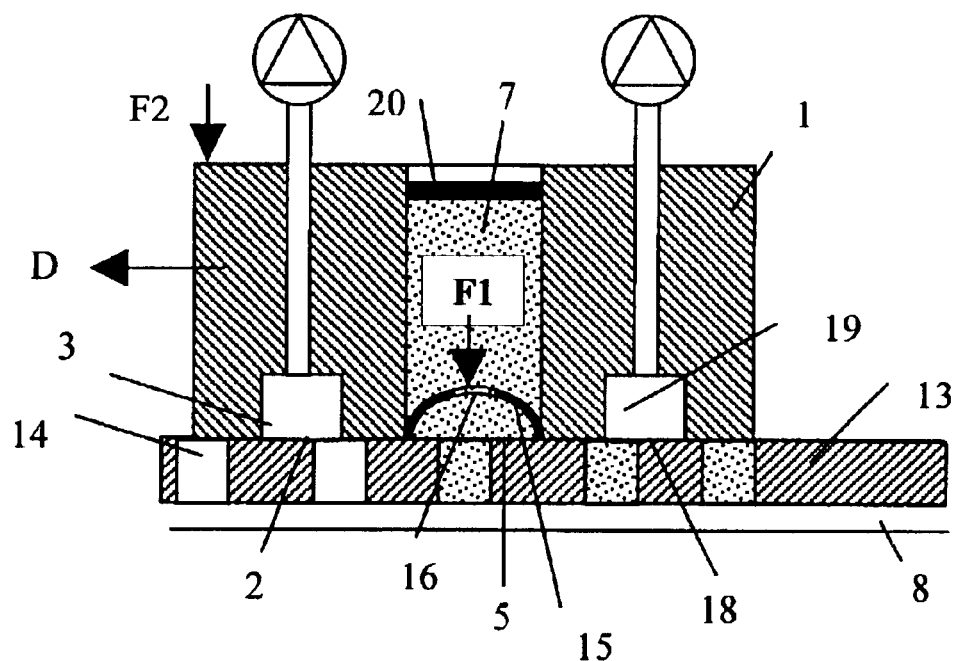
FIG. 3A illustrates, in section, a variation of the device utilizing the invention for filling a conventional stencil on a silk-screen machine.

FIG. 3A illustrates another application for a device utilizing the invention in traditional silk-screening. In this case, the blind holes are formed by the upper surface of the substrate, which is in contact with the screen (13), the openings (14) in which form the holes to be filled.

Figure 3B:
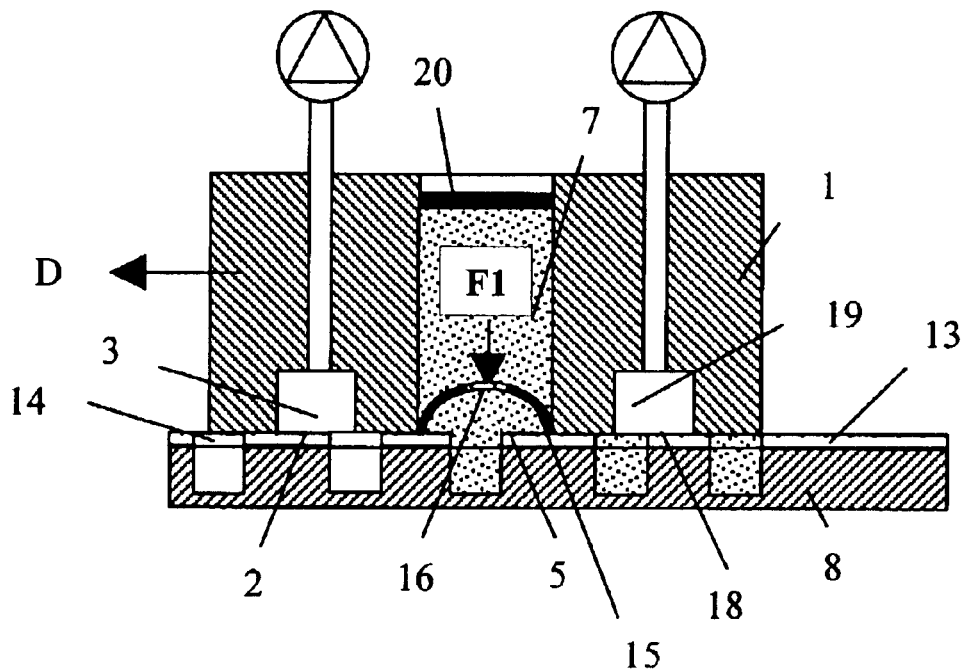
FIG. 3B illustrates, in section, the device filling holes on a substrate to which a thin, intermediate, clean stencil is attached.

FIG. 3B illustrates another utilization method where the upper surface of the substrate must not come into contact with the product, or where the surface of the substrate does not permit a device utilizing the invention to slide in an airtight manner. In this case, a very thin screen (13) can be placed between the substrate (8) and the body (1), so that the holes are partially exposed by the openings (14) in the screen (13), the bottoms of the holes always being in the substrate. To improve the scraping of excess product and to avoid any from escaping, a scraping blade (15) made, for example, of stainless steel and positioned behind the distribution slot (5) can be particularly effective. Preferably, this scraping blade is made from a curved, flexible blade in which openings (16) have been drilled to permit the passage of product. A force (F1), applied by a device that is not represented, creates a perfect vacuum and avoids the deposit of a fine film of product on the surface of the screen (13) or the substrate (8).

A device utilizing the invention can easily be used in the silk-screening process, and in such an event it may need to operate in two directions. In this case, all that is necessary is the addition of a third slot (18) identical to (2), symmetrical in relation to (5), and connected to a vacuum chamber (19). Then, when movement is made in a direction opposite to D, the vacuum in (19) is applied while keeping (3) at atmospheric pressure, while the opposite occurs for movement in direction D. In order to ensure a perfect airtight seal between the screen and the substrate as well as between the device surface (9) and the screen, a force (F2) can be carefully applied to the body (1) to press the various surfaces against each another.

To improve the speed and quality of filling, the product (7) can be pressurized, for example with the aid of a piston (20).

Figure 4:
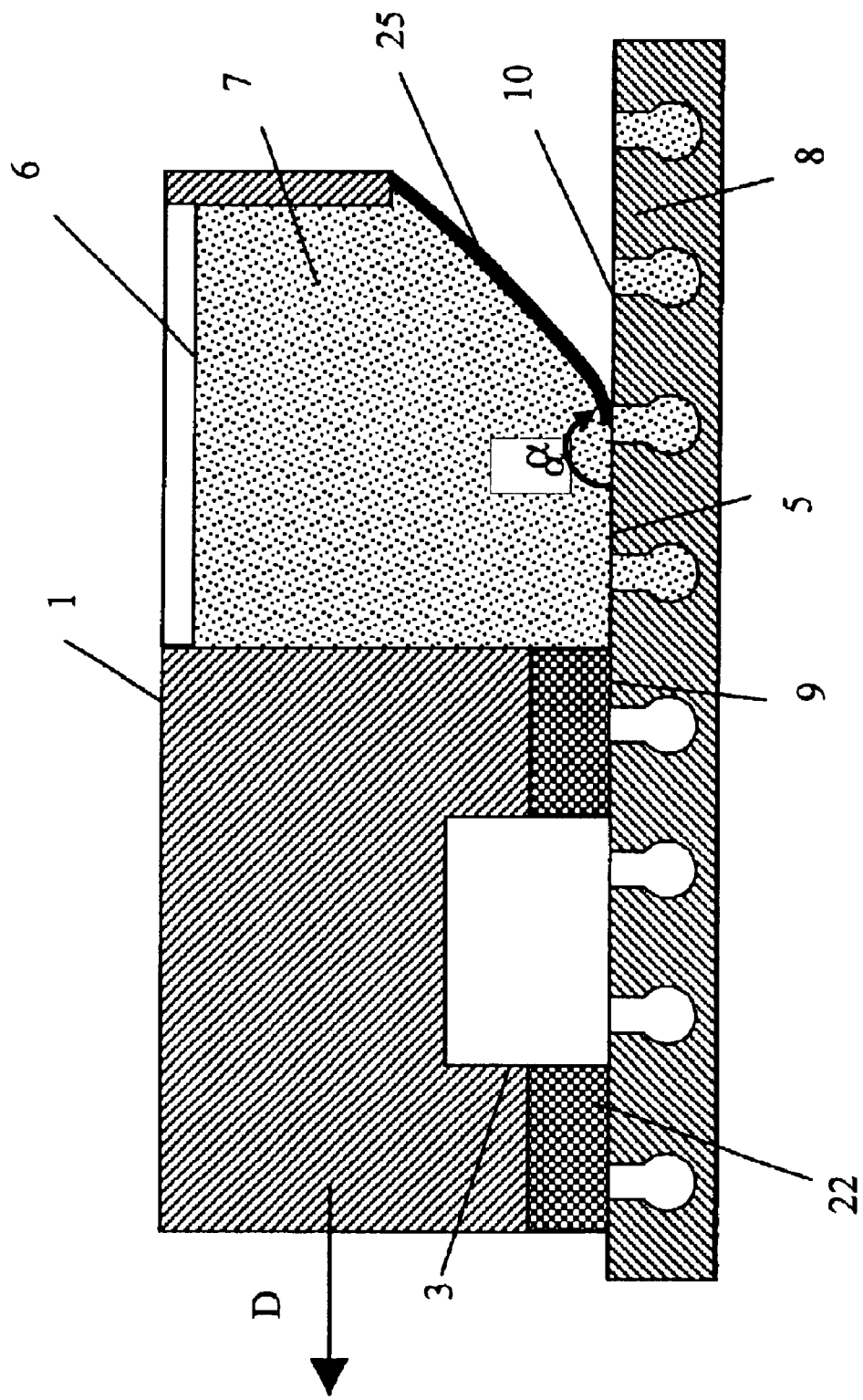
FIG. 4 illustrates, in section, another variation of a device utilizing the invention.

FIG. 4 illustrates, in section, another method of utilizing this invention. In this case, the body (1) has a deformable section (22) in contact with the substrate in order to conform to irregularities in the surface (10) or screen (13) it was designed for without harming its perfect seal in contact with surface (9). The scraping of excess product in this case is performed by a flexible blade (25) set at an angle $\propto$ greater or equal to 90 degrees, attached to the back part of (1) by a method that is not represented.

Figure 5:
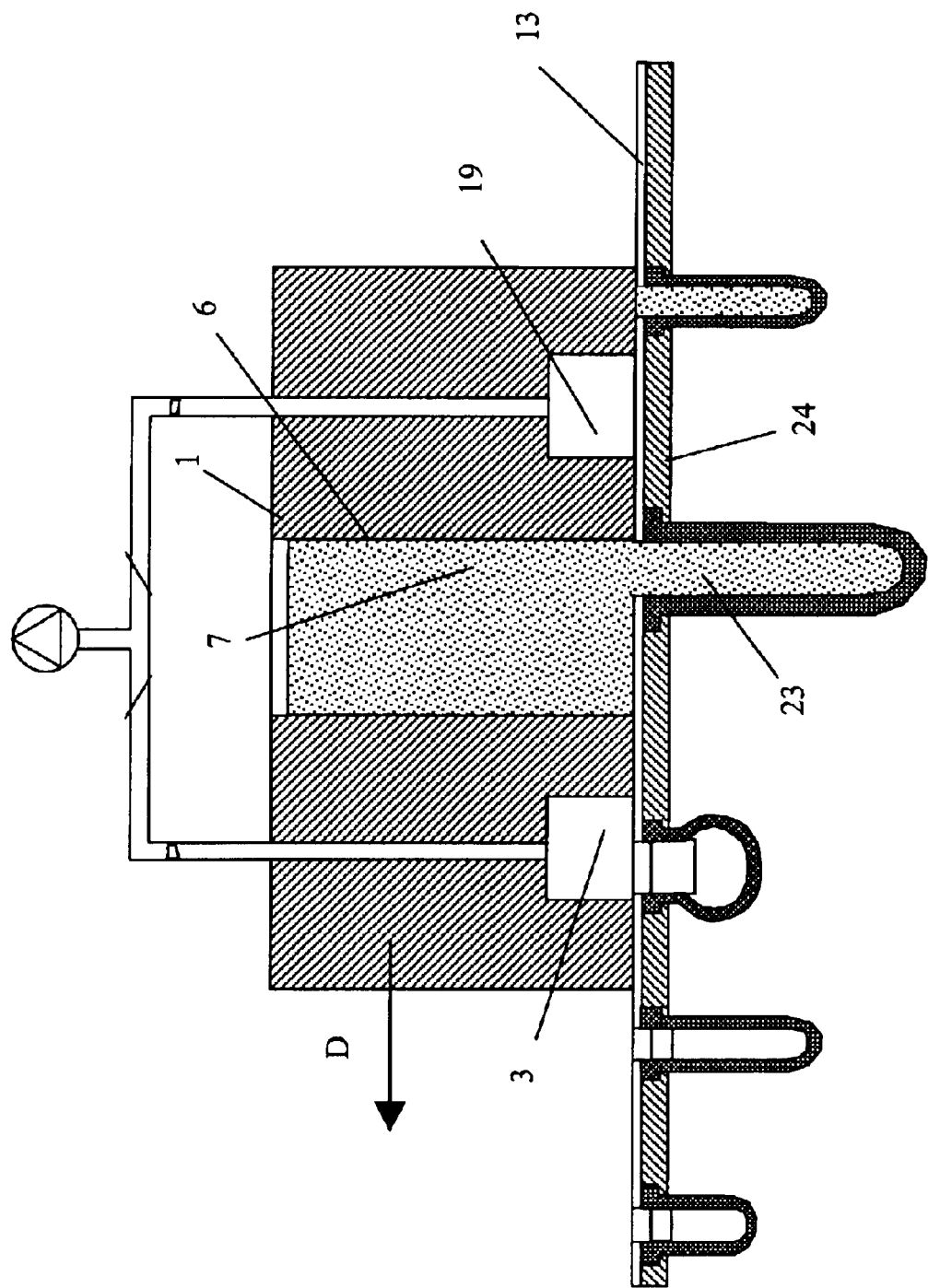
FIG. 5 illustrates a cross-section of the device used to fill identical or different tubes placed on a common rack.

FIG. 5 illustrates, in section, another possible application. In this case, the goal is to fill a group of identical or different tubes (23). The tubes (23) are positioned on a rack (24). Each tube is supported completely by the rack in order to avoid spillage. A very thin sealing screen (13) with openings arranged over the tubes to be filled is positioned above said tubes. The device (1) utilizing the invention is moved along the surface and fills the tubes (23) with the product.

Figure 6:
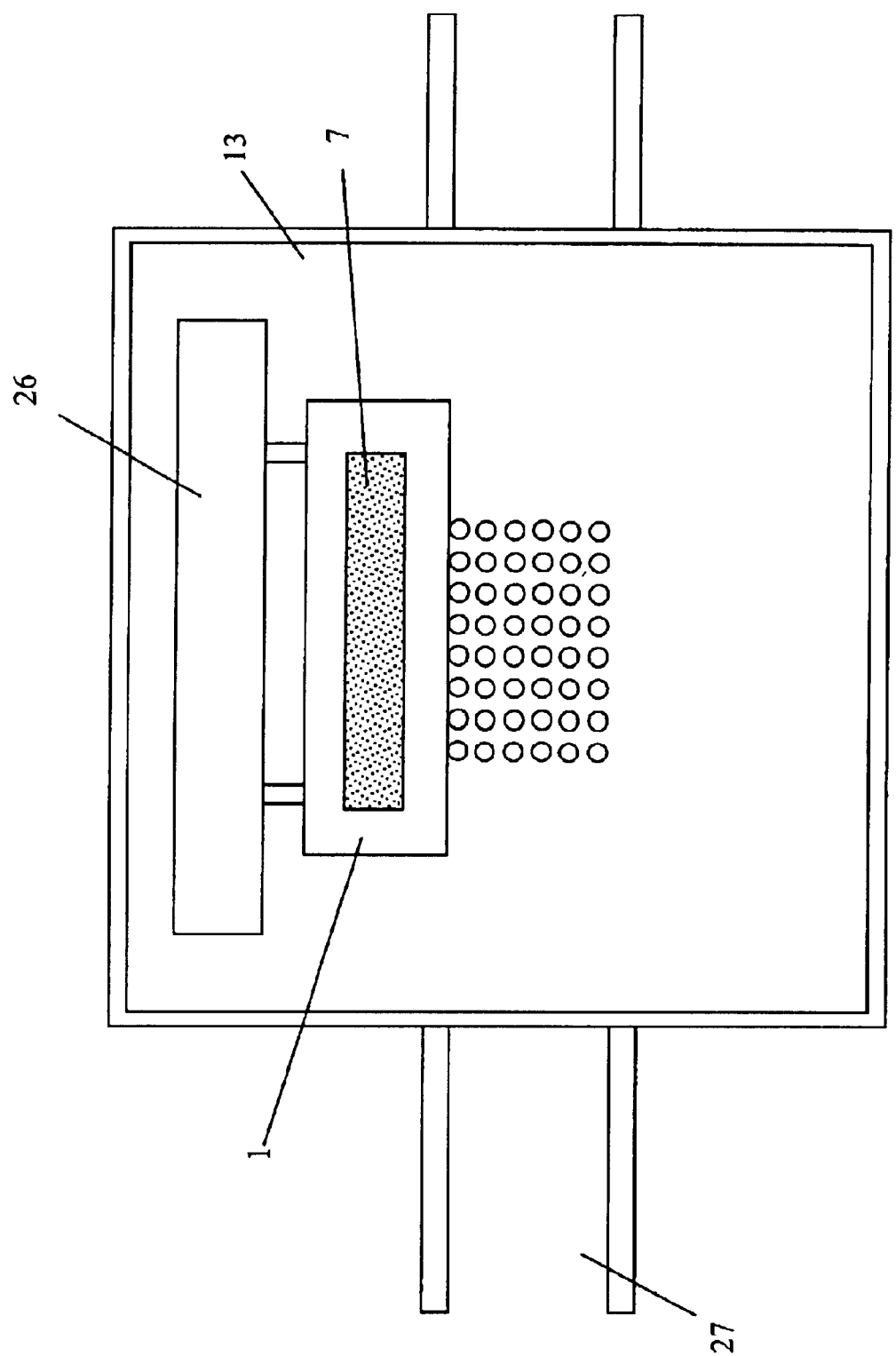
FIG. 6 illustrates a top view of a device utilizing the invention mounted on a screen printer in place of a scraper.

FIG. 6 illustrates how a device (1) utilizing this invention can be used in place of a scraper (26) on a silk-screen machine. The substrates (8) are carried by a conveyer (27), while silk-screening is accomplished through the screen (13).

A device utilizing this invention, as has been demonstrated in the preceding text, permits the complete and perfect filling of blind holes. However, it can also partially fill or seal blind holes by adjusting the pressure in vacuum chambers (3) or (19). In effect, the difference in pressure between the product reservoir and the vacuum chambers controls the amount of product that will be drawn into the hole.

A device utilizing this invention gives access to new applications for the field of interconnections, as well as for encasing in electronics applications, also known as packaging or encapsulation.

With this invention, it is possible to use the device to fill plated-through holes in a circuit board, also known as transverse holes, with a hardenable and machinable insulating resin. Such holes are made blind beforehand by an unspecified means during the filling stage. A new drilling is then performed in the insulating resin with a diameter smaller than the first hole, and this new hole is plated in connection with the upper and/or lower surfaces. In this way concentric, multi-layered, plated holes can be made. The operation can be repeated for more than 2 layers if desired.

Using this invention it is possible to encapsulate microchips on a substrate with an insulating and hardenable material. To accomplish this, a screen is used with openings that constitute a mold with undercut sides so as not to remove the product when releasing it from the mold. Even with this undercutting, it is still possible to fill completely the area enclosed by the mold thanks to the use of this device.

Figure 7:
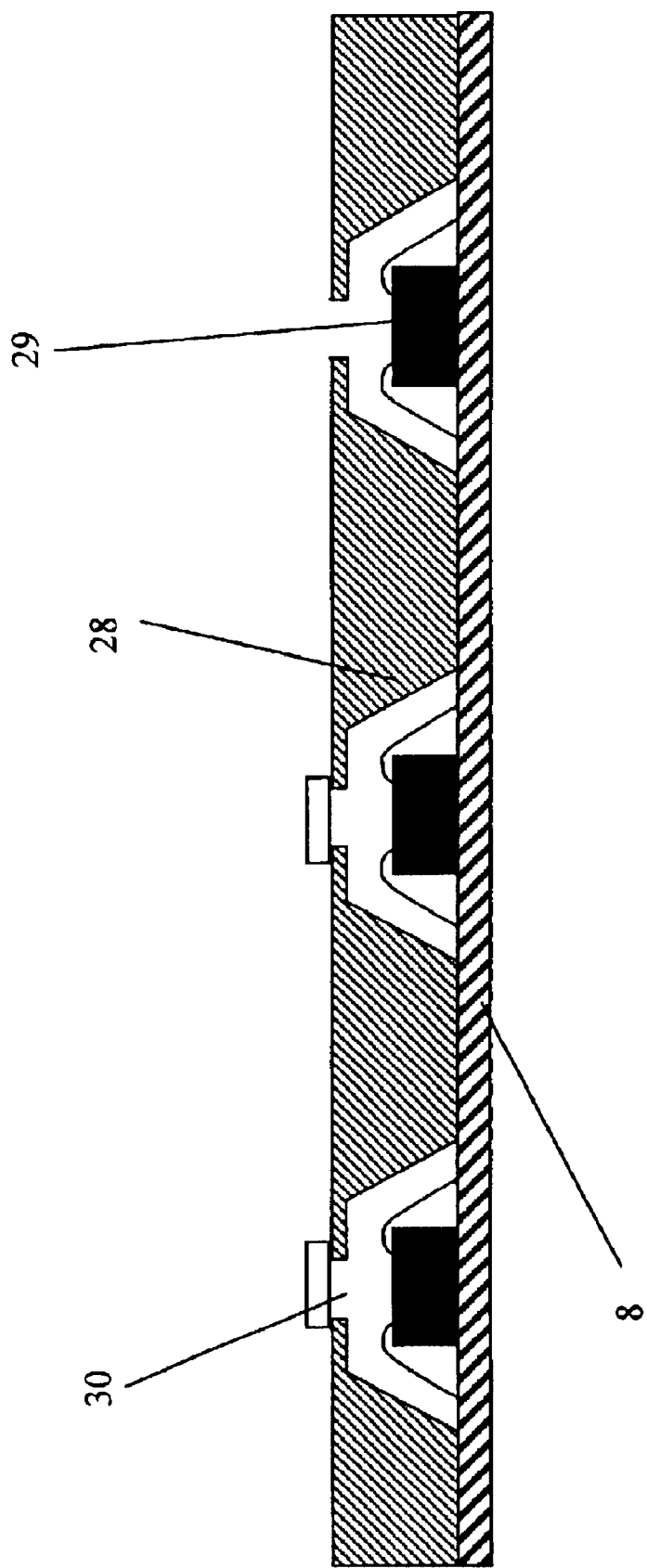
FIG. 7 illustrates the process being used to encapsulate microchips.

FIG. 7 illustrates the principle of this application with an example of a screen (28) covering a chip (29) and the hole (29) into which the product will pass.

What is claimed is:

1. Device for filling multiple blind holes opening onto a surface, with a viscous product (7), the device comprising a translatory mobile body (1) the surface containing the openings, said body containing at least two slots, the first slot exposed to the openings while moving is connected to a vacuum chamber (3), while the second slot exposed to the openings is connected to a reservoir (6) containing the product (7) to be transferred, characterized by the fact that said body (1) is in airtight contact with the surface containing the openings of said blind holes and that the first slot (2) is kept airtight by a sealing spacing from the exterior of the device and from the second slot (5) by a distance, measured parallel to the direction of travel of the device, that is larger than the largest opening.

2. Device for filling blind holes with a viscous product as in claim 1, characterized in that a third slot (18) identical to the first (2) and symmetrical to it in relation to the second (5), allows the device to operate in two directions alternately.

3. Device for filling multiple blind holes with a viscous product as in claim 1, characterized in that the lower part of the body (1) is deformable to allow for irregularities in the surface (10).

4. Method for filling multiple blind holes (11) with a viscous product (7), by implementing a body (1) having at least two slots and moved on the surface containing the openings, the first slot is connected to a vacuum chamber, while the second is connected to a reservoir (6) containing the product to be transferred, characterized in that the body (1) is in airtight contact with the surface (10) containing the openings of said blind holes and that the first slot (2) is kept airtight by a sealing spacing from the exterior of the device and from the second slot (5) by a distance, measured parallel to the direction of travel of the device, that is larger than the largest opening to be filled, and when the body (1) moves relative to the holes, the slot connected to the vacuum is the first to come into contact with the hole openings, followed by the second slot, so that the vacuum generated first in the holes draws in the product when it is exposed to the distribution slot (5), until the pressure within the hole is equal to that in the reservoir.

5. Method for filling blind holes with a viscous product as in claim 4, characterized by the fact that an intermediate screen (13) is placed between the device and the substrate.

6. Method for filling blind holes with a viscous product as in claim 4, characterized by the fact that adjustment of the pressure in the first slot (2) or (18) determines the amount of product that is drawn into the hole for sealing or partial and controlled filling of the holes.

7. Method for filling blind holes with a viscous product as in claim 4 further characterized by the fact that it is adapted to a screen-printing machine (26) in place of a scraper.

8. The method in claim 4, used for filling blind holes with a viscous product, further characterized by the fact that it fills a group of identical or different tubes (23).

9. The method of claim 4, used to flu plated-through holes in a circuit board with a hardenable and machinable insulating resin, wherein said holes have been made blind beforehand during a filling stage, the method farther characterized in that after said insulating resin has hardened, a new drilling is then made in the insulating resin with a diameter smaller than the first hole, and this new hole is plated in connection with the upper and/or lower surfaces.

10. Method of claim 4 used to encapsulate microchips (29) on a substrate with an insulating and hardenable material by tilling a mold (28) having an opening (30) therein and sides that are undercut in relation to the opening (30).

* * * * *